US008823219B2

(12) United States Patent
Farahani

(10) Patent No.: US 8,823,219 B2
(45) Date of Patent: Sep. 2, 2014

(54) HEADSET FOR RECEIVING WIRELESS POWER

(75) Inventor: Shahin Farahani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 864 days.

(21) Appl. No.: 12/854,852

(22) Filed: Aug. 11, 2010

(65) Prior Publication Data

US 2011/0062796 A1 Mar. 17, 2011

Related U.S. Application Data

(60) Provisional application No. 61/242,301, filed on Sep. 14, 2009, provisional application No. 61/317,189, filed on Mar. 24, 2010.

(51) Int. Cl.
*G01R 1/20* (2006.01)

(52) U.S. Cl.
USPC .......................................... 307/154; 343/724

(58) Field of Classification Search
USPC .................................. 307/104, 154; 343/724
See application file for complete search history.

(56) References Cited

U.S. PATENT DOCUMENTS 4,229,829 A 10/1980 Grunwald
4,992,799 A 2/1991 Garay
5,757,332 A 5/1998 Hanaoka et al.
6,424,820 B1 * 7/2002 Burdick et al. .............. 455/41.1
7,411,559 B2 * 8/2008 Leinonen et al. ............. 343/718
7,965,246 B2 * 6/2011 Yanagi et al. ................. 343/702
8,487,478 B2 * 7/2013 Kirby et al. ................... 307/104
2008/0061733 A1 3/2008 Toya
2011/0051982 A1 * 3/2011 Abreu ........................... 381/384

FOREIGN PATENT DOCUMENTS

WO WO0205589 A2 1/2002
WO WO2007018146 A1 2/2007
WO WO2009047769 A2 4/2009

OTHER PUBLICATIONS

International Search Report and Written Opinion—PCT/US2010/048817, International Search Authority—European Patent Office—Mar. 7, 2011.

* cited by examiner

*Primary Examiner* — Daniel Cavallari

(74) *Attorney, Agent, or Firm* — Knobbe, Marten, Olson & Bear LLP

(57) ABSTRACT

Exemplary embodiments are directed to device for selectively forming an open loop antenna or a closed loop antenna. A device may include a wireless power receiver and a receive antenna operably coupled to the wireless power receiver and having a portion for selectively forming an open loop antenna or a closed loop antenna.

30 Claims, 14 Drawing Sheets

HEADSET FOR RECEIVING WIRELESS POWER

CLAIM OF PRIORITY UNDER 35 U.S.C. §119

This application claims priority under 35 U.S.C. §119(e) to:

U.S. Provisional Patent Application 61/242,301 entitled "MAGNETICALLY RESONANT ANTENNA INTEGRATED IN THE EAR CLIPS" filed on Sep. 14, 2009, the disclosure of which is hereby incorporated by reference in its entirety; and U.S. Provisional Patent Application 61/317,189 entitled "MAGNETICALLY RESONANT ANTENNA INTEGRATED IN HEADSET" filed on Mar. 24, 2010, the disclosure of which is hereby incorporated by reference in its entirety.

BACKGROUND

1. Field

The present invention relates to wireless power, and more specifically, to methods and device related to a headset for receiving wireless power.

2. Background

Typically, each battery powered device requires its own charger and power source, which is usually an AC power outlet. This becomes unwieldy when many devices need charging.

Approaches are being developed that use over the air power transmission between a transmitter and the device to be charged. These generally fall into two categories. One is based on the coupling of plane wave radiation (also called far-field radiation) between a transmit antenna and receive antenna on the device to be charged which collects the radiated power and rectifies it for charging the battery. Antennas are generally of resonant length in order to improve the coupling efficiency. This approach suffers from the fact that the power coupling falls off quickly with distance between the antennas. So charging over reasonable distances (e.g., >1-2 m) becomes difficult. Additionally, since the system radiates plane waves, unintentional radiation can interfere with other systems if not properly controlled through filtering.

Other approaches are based on inductive coupling between a transmit antenna embedded, for example, in a "charging" mat or surface and a receive antenna plus rectifying circuit embedded in the host device to be charged. This approach has the disadvantage that the spacing between transmit and receive antennas must be very close (e.g. mms). Though this approach does have the capability to simultaneously charge multiple devices in the same area, this area is typically small, hence the user must locate the devices to a specific area.

A need exists for a headset including an antenna integrated therein in a manner to enhance the size of the antenna and for enabling the antenna to be selectively configurable in either an open or closed loop configuration.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The words "wireless power" is used herein to mean any form of energy associated with electric fields, magnetic fields, electromagnetic fields, or otherwise that is transmitted between from a transmitter to a receiver without the use of physical electromagnetic conductors.

Figure 1:
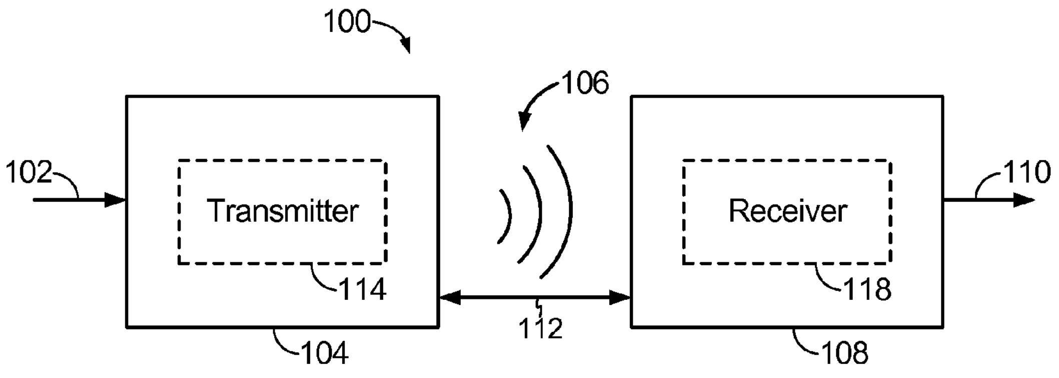
FIG. 1 shows a simplified block diagram of a wireless power transfer system.

FIG. 1 illustrates a wireless transmission or charging system 100, in accordance with various exemplary embodiments of the present invention. Input power 102 is provided to a transmitter 104 for generating a radiated field 106 for providing energy transfer. A receiver 108 couples to the radiated field 106 and generates an output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship and when the resonant frequency of receiver 108 and the resonant frequency of transmitter 104 are very close, transmission losses between the transmitter 104 and the receiver 108 are minimal when the receiver 108 is located in the "near-field" of the radiated field 106.

Transmitter 104 further includes a transmit antenna 114 for providing a means for energy transmission and receiver 108 further includes a receive antenna 118 for providing a means for energy reception. The transmit and receive antennas are sized according to applications and devices to be associated therewith. As stated, an efficient energy transfer occurs by coupling a large portion of the energy in the near-field of the transmitting antenna to a receiving antenna rather than propagating most of the energy in an electromagnetic wave to the far field. When in this near-field a coupling mode may be developed between the transmit antenna 114 and the receive antenna 118. The area around the antennas 114 and 118 where this near-field coupling may occur is referred to herein as a coupling-mode region.

Figure 2:
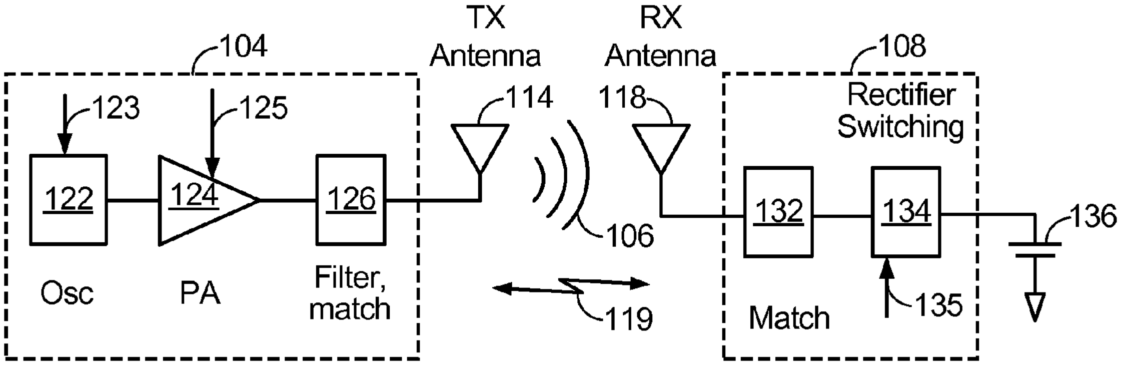
FIG. 2 shows a simplified schematic diagram of a wireless power transfer system.

FIG. 2 shows a simplified schematic diagram of a wireless power transfer system. The transmitter 104 includes an oscillator 122, a power amplifier 124 and a filter and matching circuit 126. The oscillator is configured to generate a signal at a desired frequency, which may be adjusted in response to adjustment signal 123. The oscillator signal may be amplified by the power amplifier 124 with an amplification amount responsive to control signal 125. The filter and matching circuit 126 may be included to filter out harmonics or other unwanted frequencies and match the impedance of the transmitter 104 to the transmit antenna 114.

The receiver 108 may include a matching circuit 132 and a rectifier and switching circuit 134 to generate a DC power output to charge a battery 136 as shown in FIG. 2 or power a device coupled to the receiver (not shown). The matching circuit 132 may be included to match the impedance of the receiver 108 to the receive antenna 118. The receiver 108 and transmitter 104 may communicate on a separate communication channel 119 (e.g., Bluetooth, zigbee, cellular, etc).

Figure 3:
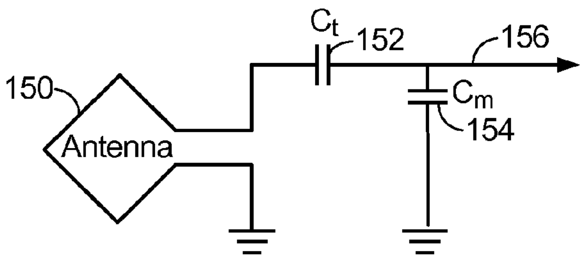
FIG. 3 illustrates a schematic diagram of a loop antenna for use in exemplary embodiments of the present invention.

As illustrated in FIG. 3, antennas used in exemplary embodiments may be configured as a "loop" antenna 150, which may also be referred to herein as a "magnetic" antenna. Loop antennas may be configured to include an air core or a physical core such as a ferrite core. Air core loop antennas may be more tolerable to extraneous physical devices placed in the vicinity of the core. Furthermore, an air core loop antenna allows the placement of other components within the core area. In addition, an air core loop may more readily enable placement of the receive antenna 118 (FIG. 2) within a plane of the transmit antenna 114 (FIG. 2) where the coupled-mode region of the transmit antenna 114 (FIG. 2) may be more powerful.

As stated, efficient transfer of energy between the transmitter 104 and receiver 108 occurs during matched or nearly matched resonance between the transmitter 104 and the receiver 108. However, even when resonance between the transmitter 104 and receiver 108 are not matched, energy may be transferred at a lower efficiency. Transfer of energy occurs by coupling energy from the near-field of the transmitting antenna to the receiving antenna residing in the neighborhood where this near-field is established rather than propagating the energy from the transmitting antenna into free space.

The resonant frequency of the loop or magnetic antennas is based on the inductance and capacitance. Inductance in a loop antenna is generally simply the inductance created by the loop, whereas, capacitance is generally added to the loop antenna's inductance to create a resonant structure at a desired resonant frequency. As a non-limiting example, capacitor 152 and capacitor 154 may be added to the antenna to create a resonant circuit that generates resonant signal 156. Accordingly, for larger diameter loop antennas, the size of capacitance needed to induce resonance decreases as the diameter or inductance of the loop increases. Furthermore, as the diameter of the loop or magnetic antenna increases, the efficient energy transfer area of the near-field increases. Of course, other resonant circuits are possible. As another non-limiting example, a capacitor may be placed in parallel between the two terminals of the loop antenna. In addition, those of ordinary skill in the art will recognize that for transmit antennas the resonant signal 156 may be an input to the loop antenna 150.

Figure 4:
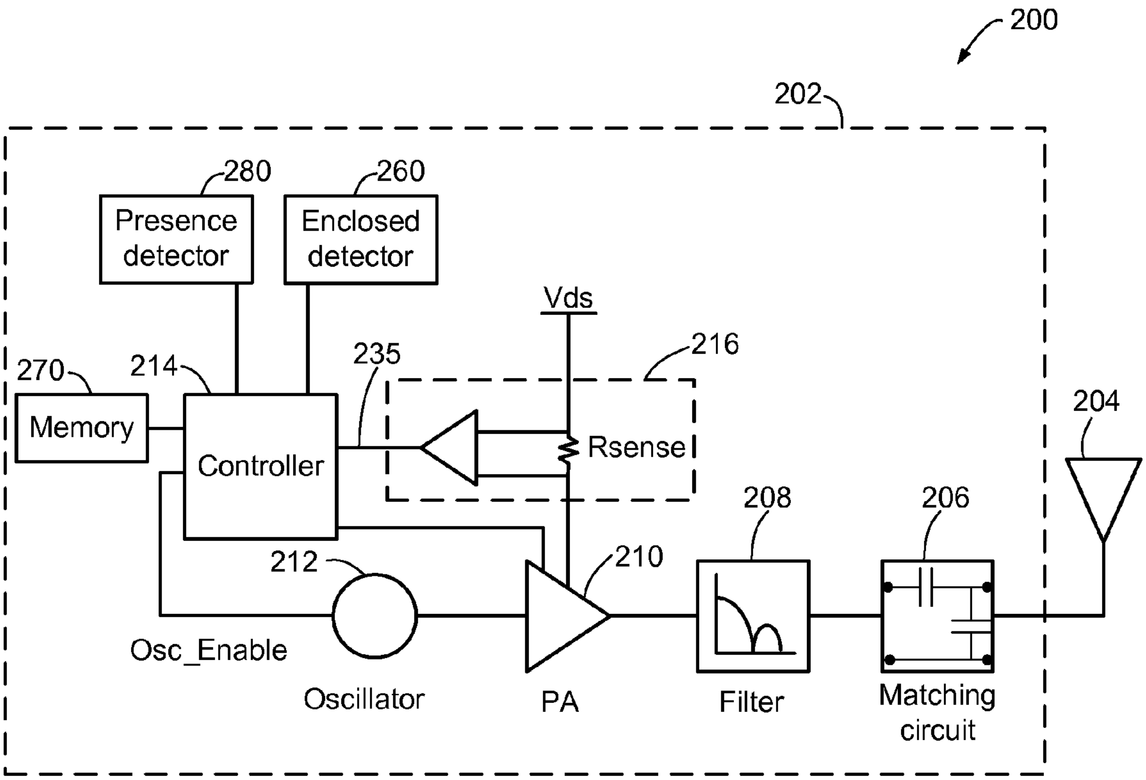
FIG. 4 is a simplified block diagram of a transmitter, in accordance with an exemplary embodiment of the present invention.

FIG. 4 is a simplified block diagram of a transmitter 200, in accordance with an exemplary embodiment of the present invention. The transmitter 200 includes transmit circuitry 202 and a transmit antenna 204. Generally, transmit circuitry 202 provides RF power to the transmit antenna 204 by providing an oscillating signal resulting in generation of near-field energy about the transmit antenna 204. By way of example, transmitter 200 may operate at the 13.56 MHz ISM band.

Exemplary transmit circuitry 202 includes a fixed impedance matching circuit 206 for matching the impedance of the transmit circuitry 202 (e.g., 50 ohms) to the transmit antenna 204 and a low pass filter (LPF) 208 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that can be varied based on measurable transmit metrics, such as output power to the antenna or DC current draw by the power amplifier. Transmit circuitry 202 further includes a power amplifier 210 configured to drive an RF signal as determined by an oscillator 212. The transmit circuitry may be comprised of discrete devices or circuits, or alternately, may be comprised of an integrated assembly. An exemplary RF power output from transmit antenna 204 may be on the order of 2.5 Watts.

Transmit circuitry 202 further includes a controller 214 for enabling the oscillator 212 during transmit phases (or duty cycles) for specific receivers, for adjusting the frequency of the oscillator, and for adjusting the output power level for implementing a communication protocol for interacting with neighboring devices through their attached receivers.

The transmit circuitry 202 may further include a load sensing circuit 216 for detecting the presence or absence of active receivers in the vicinity of the near-field generated by transmit antenna 204. By way of example, a load sensing circuit 216 monitors the current flowing to the power amplifier 210, which is affected by the presence or absence of active receivers in the vicinity of the near-field generated by transmit antenna 204. Detection of changes to the loading on the power amplifier 210 are monitored by controller 214 for use in determining whether to enable the oscillator 212 for transmitting energy to communicate with an active receiver.

Transmit antenna 204 may be implemented as an antenna strip with the thickness, width and metal type selected to keep resistive losses low. In a conventional implementation, the transmit antenna 204 can generally be configured for association with a larger structure such as a table, mat, lamp or other less portable configuration. Accordingly, the transmit antenna 204 generally will not need "turns" in order to be of a practical dimension. An exemplary implementation of a transmit antenna 204 may be "electrically small" (i.e., fraction of the wavelength) and tuned to resonate at lower usable frequencies by using capacitors to define the resonant frequency. In an exemplary application where the transmit antenna 204 may be larger in diameter, or length of side if a square loop, (e.g., 0.50 meters) relative to the receive antenna, the transmit antenna 204 will not necessarily need a large number of turns to obtain a reasonable capacitance.

The transmitter 200 may gather and track information about the whereabouts and status of receiver devices that may be associated with the transmitter 200. Thus, the transmitter circuitry 202 may include a presence detector 280, an enclosed detector 290, or a combination thereof, connected to the controller 214 (also referred to as a processor herein). The controller 214 may adjust an amount of power delivered by the amplifier 210 in response to presence signals from the presence detector 280 and the enclosed detector 290. The transmitter may receive power through a number of power sources, such as, for example, an AC-DC converter (not shown) to convert conventional AC power present in a building, a DC-DC converter (not shown) to convert a conventional DC power source to a voltage suitable for the transmitter 200, or directly from a conventional DC power source (not shown).

As a non-limiting example, the presence detector 280 may be a motion detector utilized to sense the initial presence of a device to be charged that is inserted into the coverage area of the transmitter. After detection, the transmitter may be turned on and the RF power received by the device may be used to toggle a switch on the Rx device in a pre-determined manner, which in turn results in changes to the driving point impedance of the transmitter.

As another non-limiting example, the presence detector 280 may be a detector capable of detecting a human, for example, by infrared detection, motion detection, or other suitable means. In some exemplary embodiments, there may be regulations limiting the amount of power that a transmit antenna may transmit at a specific frequency. In some cases, these regulations are meant to protect humans from electromagnetic radiation. However, there may be environments where transmit antennas are placed in areas not occupied by humans, or occupied infrequently by humans, such as, for example, garages, factory floors, shops, and the like. If these environments are free from humans, it may be permissible to increase the power output of the transmit antennas above the normal power restrictions regulations. In other words, the controller 214 may adjust the power output of the transmit antenna 204 to a regulatory level or lower in response to human presence and adjust the power output of the transmit antenna 204 to a level above the regulatory level when a human is outside a regulatory distance from the electromagnetic field of the transmit antenna 204.

As a non-limiting example, the enclosed detector 290 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 200 does not remain on indefinitely may be used. In this case, the transmitter 200 may be programmed to shut off after a user-determined amount of time. This feature prevents the transmitter 200, notably the power amplifier 210, from running long after the wireless devices in its perimeter are fully charged. This event may be due to the failure of the circuit to detect the signal sent from either the repeater or the receive coil that a device is fully charged. To prevent the transmitter 200 from automatically shutting down if another device is placed in its perimeter, the transmitter 200 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
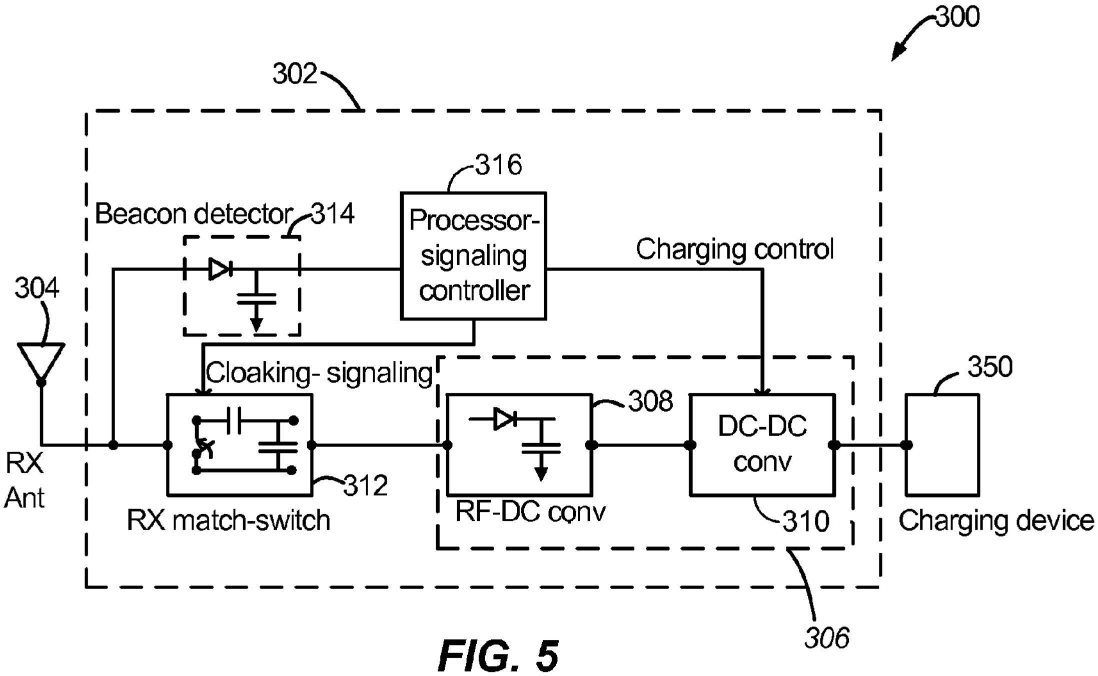
FIG. 5 is a simplified block diagram of a receiver, in accordance with an exemplary embodiment of the present invention.

FIG. 5 is a simplified block diagram of a receiver 300, in accordance with an exemplary embodiment of the present invention. The receiver 300 includes receive circuitry 302 and a receive antenna 304. Receiver 300 further couples to device 350 for providing received power thereto. It should be noted that receiver 300 is illustrated as being external to device 350 but may be integrated into device 350. Generally, energy is propagated wirelessly to receive antenna 304 and then coupled through receive circuitry 302 to device 350.

Receive antenna 304 is tuned to resonate at the same frequency, or near the same frequency, as transmit antenna 204 (FIG. 4). Receive antenna 304 may be similarly dimensioned with transmit antenna 204 or may be differently sized based upon the dimensions of the associated device 350. By way of example, device 350 may be a portable electronic device having diametric or length dimension smaller that the diameter of length of transmit antenna 204. In such an example, receive antenna 304 may be implemented as a multi-turn antenna in order to reduce the capacitance value of a tuning capacitor (not shown) and increase the receive antenna's impedance. By way of example, receive antenna 304 may be placed around the substantial circumference of device 350 in order to maximize the antenna diameter and reduce the number of loop turns (i.e., windings) of the receive antenna and the inter-winding capacitance.

Receive circuitry 302 provides an impedance match to the receive antenna 304. Receive circuitry 302 includes power conversion circuitry 306 for converting a received RF energy source into charging power for use by device 350. Power conversion circuitry 306 includes an RF-to-DC converter 308 and may also in include a DC-to-DC converter 310. RF-to-DC converter 308 rectifies the RF energy signal received at receive antenna 304 into a non-alternating power while DC-to-DC converter 310 converts the rectified RF energy signal into an energy potential (e.g., voltage) that is compatible with device 350. Various RF-to-DC converters are contemplated, including partial and full rectifiers, regulators, bridges, doublers, as well as linear and switching converters.

Receive circuitry 302 may further include switching circuitry 312 for connecting receive antenna 304 to the power conversion circuitry 306 or alternatively for disconnecting the power conversion circuitry 306. Disconnecting receive antenna 304 from power conversion circuitry 306 not only suspends charging of device 350, but also changes the "load" as "seen" by the transmitter 200 (FIG. 2).

As disclosed above, transmitter 200 includes load sensing circuit 216 which detects fluctuations in the bias current provided to transmitter power amplifier 210. Accordingly, transmitter 200 has a mechanism for determining when receivers are present in the transmitter's near-field.

When multiple receivers 300 are present in a transmitter's near-field, it may be desirable to time-multiplex the loading and unloading of one or more receivers to enable other receivers to more efficiently couple to the transmitter. A receiver may also be cloaked in order to eliminate coupling to other nearby receivers or to reduce loading on nearby transmitters. This "unloading" of a receiver is also known herein as a "cloaking." Furthermore, this switching between unloading and loading controlled by receiver 300 and detected by transmitter 200 provides a communication mechanism from receiver 300 to transmitter 200 as is explained more fully below. Additionally, a protocol can be associated with the switching which enables the sending of a message from receiver 300 to transmitter 200. By way of example, a switching speed may be on the order of 100 μsec.

In an exemplary embodiment, communication between the transmitter and the receiver refers to a device sensing and charging control mechanism, rather than conventional two-way communication. In other words, the transmitter uses on/off keying of the transmitted signal to adjust whether energy is available in the near-filed. The receivers interpret these changes in energy as a message from the transmitter. From the receiver side, the receiver uses tuning and de-tuning of the receive antenna to adjust how much power is being accepted from the near-field. The transmitter can detect this difference in power used from the near-field and interpret these changes as a message from the receiver.

Receive circuitry 302 may further include signaling detector and beacon circuitry 314 used to identify received energy fluctuations, which may correspond to informational signaling from the transmitter to the receiver. Furthermore, signaling and beacon circuitry 314 may also be used to detect the transmission of a reduced RF signal energy (i.e., a beacon signal) and to rectify the reduced RF signal energy into a nominal power for awakening either un-powered or power-depleted circuits within receive circuitry 302 in order to configure receive circuitry 302 for wireless charging.

Receive circuitry 302 further includes processor 316 for coordinating the processes of receiver 300 described herein including the control of switching circuitry 312 described herein. Cloaking of receiver 300 may also occur upon the occurrence of other events including detection of an external wired charging source (e.g., wall/USB power) providing charging power to device 350. Processor 316, in addition to controlling the cloaking of the receiver, may also monitor beacon circuitry 314 to determine a beacon state and extract messages sent from the transmitter. Processor 316 may also adjust DC-to-DC converter 310 for improved performance.

Figure 6:
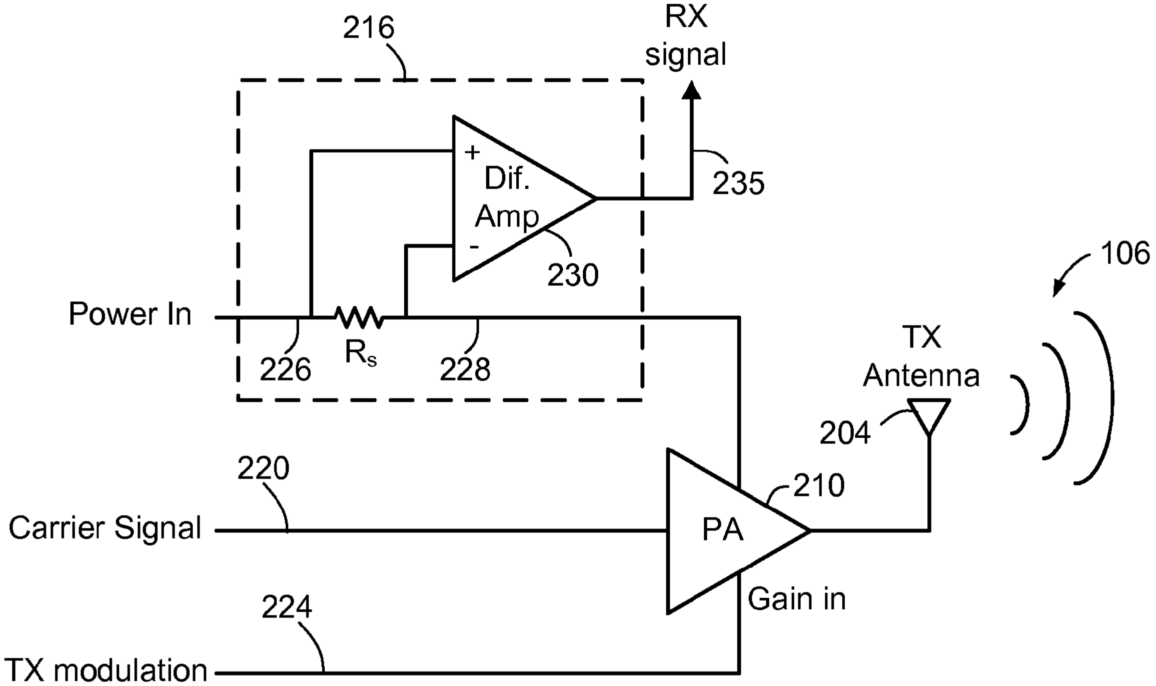
FIG. 6 shows a simplified schematic of a portion of transmit circuitry for carrying out messaging between a transmitter and a receiver.

FIG. 6 shows a simplified schematic of a portion of transmit circuitry for carrying out messaging between a transmitter and a receiver. In some exemplary embodiments of the present invention, a means for communication may be enabled between the transmitter and the receiver. In FIG. 6 a power amplifier 210 drives the transmit antenna 204 to generate the radiated field. The power amplifier is driven by a carrier signal 220 that is oscillating at a desired frequency for the transmit antenna 204. A transmit modulation signal 224 is used to control the output of the power amplifier 210.

The transmit circuitry can send signals to receivers by using an ON/OFF keying process on the power amplifier 210. In other words, when the transmit modulation signal 224 is asserted, the power amplifier 210 will drive the frequency of the carrier signal 220 out on the transmit antenna 204. When the transmit modulation signal 224 is negated, the power amplifier will not drive out any frequency on the transmit antenna 204.

The transmit circuitry of FIG. 6 also includes a load sensing circuit 216 that supplies power to the power amplifier 210 and generates a receive signal 235 output. In the load sensing circuit 216 a voltage drop across resistor $R_S$ develops between the power in signal 226 and the power supply 228 to the power amplifier 210. Any change in the power consumed by the power amplifier 210 will cause a change in the voltage drop that will be amplified by differential amplifier 230. When the transmit antenna is in coupled mode with a receive antenna in a receiver (not shown in FIG. 6) the amount of current drawn by the power amplifier 210 will change. In other words, if no coupled mode resonance exist for the transmit antenna 204, the power required to drive the radiated field will be a first amount. If a coupled mode resonance exists, the amount of power consumed by the power amplifier 210 will go up because much of the power is being coupled into the receive antenna. Thus, the receive signal 235 can indicate the presence of a receive antenna coupled to the transmit antenna 235 and can also detect signals sent from the receive antenna. Additionally, a change in receiver current draw will be observable in the transmitter's power amplifier current draw, and this change can be used to detect signals from the receive antennas.

Exemplary embodiments of the invention are directed to devices and methods related to a receiver including at least one receive antenna configured for wirelessly receiving power. The receiver and at least one associated receive antenna may be integrated in a device, such as a headset. It is noted that the term "headset," as used herein may comprise an ear piece, a head piece, a hearing-aid, headphones, or a combination thereof.

Figure 7A:
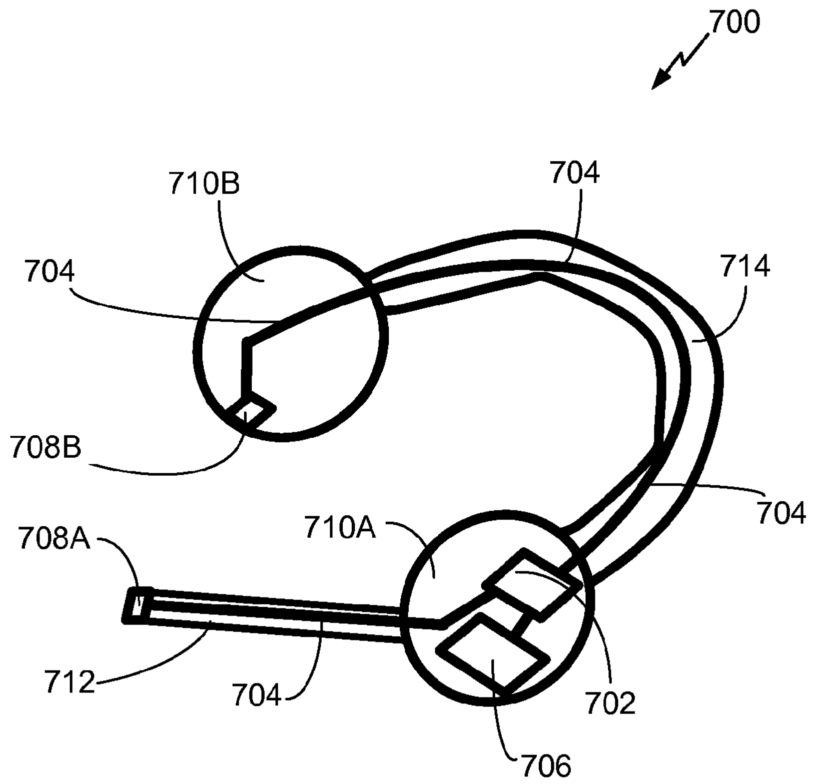
FIG. 7A illustrates a wireless power device including a wireless power receiver, according to an exemplary embodiment of the present invention.

FIG. 7A illustrates a device 700 having a receiver 702 and a receive antenna 704 integrated therein. Device 700 is depicted in FIG. 7A as a headset including a retention element 714, ear elements 710A and 710B, and microphone boom 712. Device 700 may further include an energy storage device 706 operably coupled to receiver 702. Energy storage device 706 may comprise, for example only, a battery. As illustrated in FIG. 7A, receiver 702, energy storage device 706, and a portion of antenna 704 is integrated in ear element 710A.

Moreover, it is noted that boom 712, retention element 714, and ear element 710B each have a portion of receive antenna 704 integrated therein. Device 700 further includes a connector 708B coupled to antenna 704 and integrated within ear element 710B. In addition, device 700 includes another connector 708A coupled to antenna 704 and integrated within boom 712. It is noted that each of connector 708A and connector 708B may be at least partially exposed through boom 712 and ear element 710B, respectively.

According to one exemplary embodiment, device 700 is configurable so as to enable connector 708A and connector 708B to be coupled together. It is noted that connector 708A and connector 708B may be coupled together by adjusting a position of or more elements (e.g., retention element 714, ear element 710A, ear element 710B, and boom 712) of device 700. By way of example, boom 712 and ear element 710A may be coupled together in a manner to allow boom 712 to rotate about ear element 710 and enable connector 708A to come into contact with connector 708B. As a more specific example, boom 712 may rotate about ear element 710 and "snap" into a position wherein connector 708A and connector 708B are coupled together.

Coupling connector 708A and connector 708B together provides for a closed loop loop extending from first connector 708A, through each of boom 712, ear element 710A, retention element 714, and ear element 710B to second connector 708B. As will be appreciated by a person having ordinary skill in the art, if connector 708A and connector 708B are coupled together (i.e., a closed loop is formed), antenna 704 may be configured to receive power wirelessly transmitted from a wireless power source.

Figure 7B:
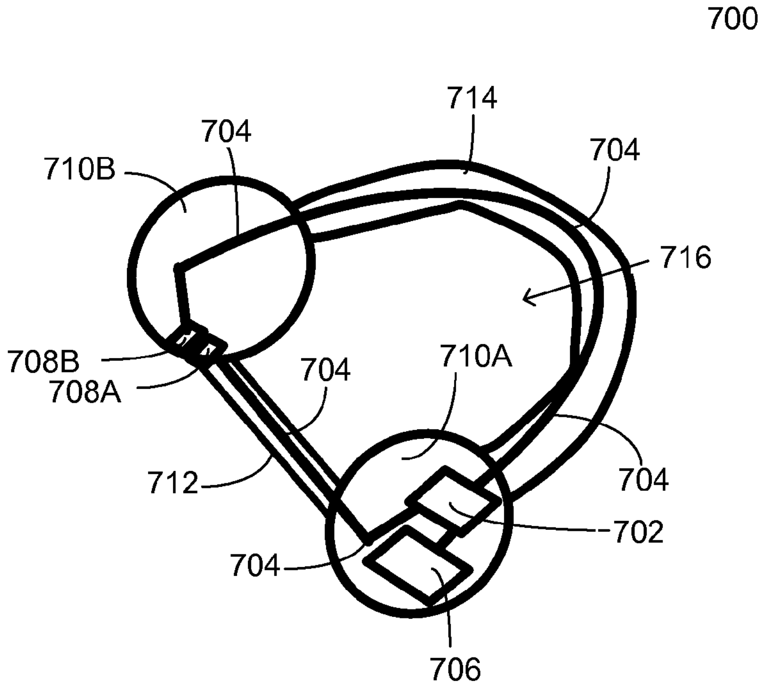
FIG. 7B is another illustration of the wireless power device of FIG. 7A in a configuration for receiving wireless power, in accordance with an exemplary embodiment of the present invention.

It is noted that in FIG. 7A, device 700 is depicted as being in a configuration wherein first connector 708A and second connector 708B are not in contact with one another and, therefore, antenna 704 is configured as an open loop antenna. FIG. 7B is an illustration of device 700 wherein connector 708A and connector 708B are in contact and, therefore, antenna 704 is configured as a closed loop. As illustrated in FIG. 7B, a gap 716, which comprises air, exists between at least a portion retention element 714, ear elements 710A and 710B, and boom 712. As such, antenna 704 may comprise an air core loop antenna.

Figure 7C:
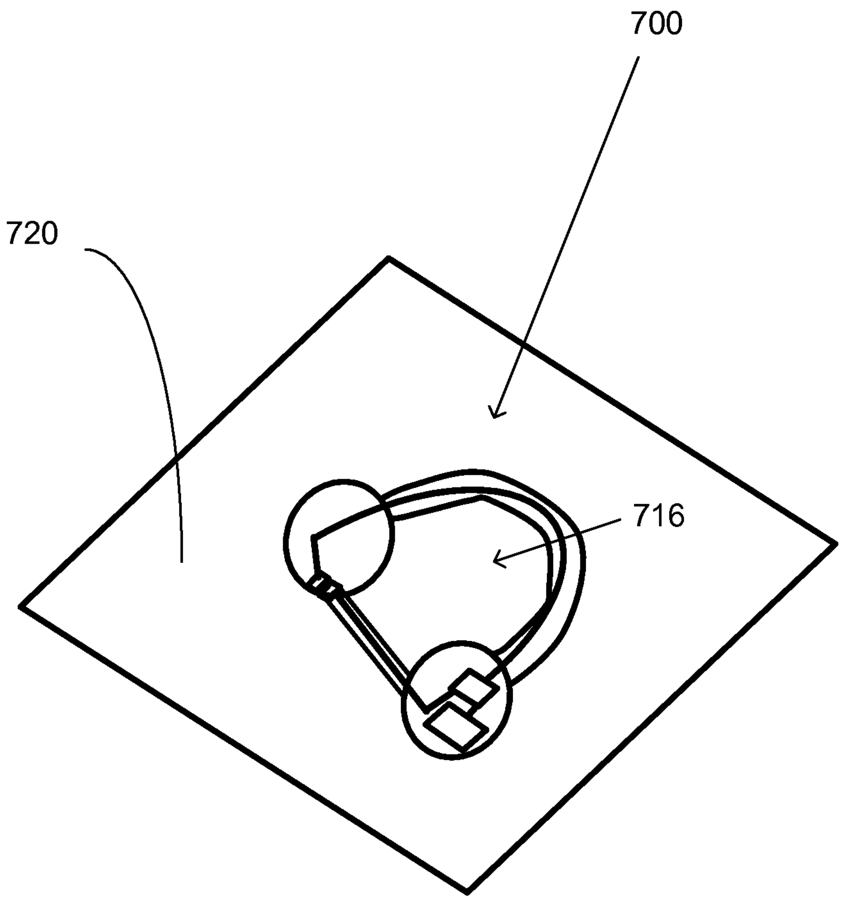
FIG. 7C depicts the wireless power device of FIG. 7B positioned within a charging region of another wireless device including a wireless power transmitter, in accordance with an exemplary embodiment of the present invention.

FIG. 7C is an illustration of device 700 positioned within a charging region of a wireless power source 720 that includes a wireless power transmitter (e.g., transmitter 200 of FIG. 4). As illustrated in FIG. 7C, connector 708A is in contact with connector 708B and, therefore, antenna 704 is configured as a closed loop antenna. Accordingly, as configured in the illustration of FIG. 7C, antenna 704 may receive power wirelessly transmitted from wireless power source 720. Upon reception thereof, power may be conveyed to energy storage device 706 via receiver 704.

During a contemplated operation, device 700 may be configured in a manner so as to connect connector 708A with connector 708B and, thus, form a closed loop antenna within device 700. Furthermore, upon device 700 being positioned within a near-field region of a wireless power source, device 700 and, more specifically, antenna 704, may wirelessly receive power from the wireless power source. As will be appreciated by a person having ordinary skill in the art, device 700 is configured to prevent receipt of wireless power while in use (i.e., while antenna 704 is an open loop; see FIG. 7A), and, therefore, device 700 may provide enhanced safety to a user of device 700.

Figure 8A:
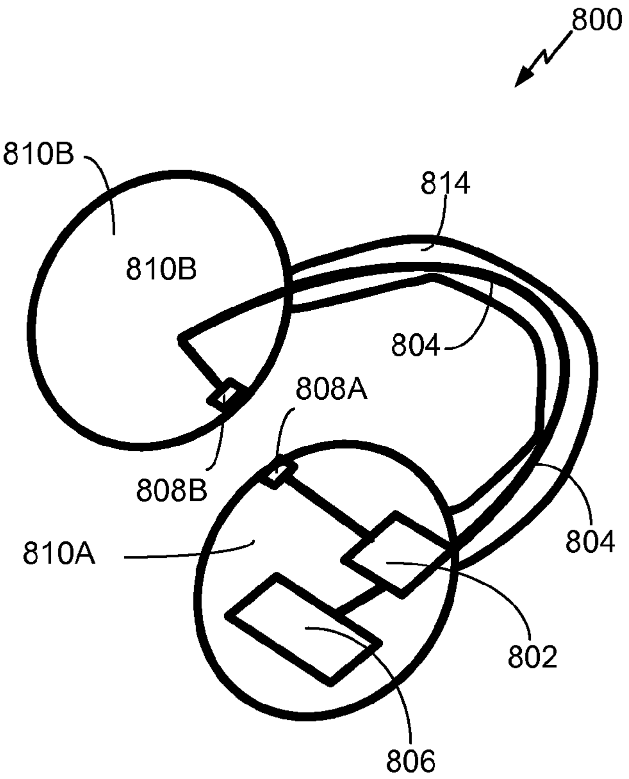
FIG. 8A illustrates another wireless power device including a wireless power receiver, according to an exemplary embodiment of the present invention.

FIG. 8A illustrates a device 800 having a receiver 802 and a receive antenna 804 integrated therein. Device 800 is depicted in FIG. 8A as a headset including a retention element 814, and ear elements 810A and 810B. Device 800 may further include an energy storage device 806 operably coupled to receiver 802. Energy storage device 806 may comprise, for example only, a battery. As illustrated in FIG. 8A, receiver 802, energy storage device 806, and a portion of antenna 804 are integrated in ear element 810A. Moreover, it is noted that retention element 814 and ear element 810B each have a portion of receive antenna 804 integrated therein.

Device 800 further includes a connector 808B coupled to antenna 804 and integrated within ear element 810B. In addition, device 800 includes another connector 808A coupled to antenna 804 and integrated within ear element 810A. It is noted that each of connector 808A and connector 808B may be at least partially exposed through respective ear elements.

According to one exemplary embodiment, device 800 is configurable so as to enable connector 808A and connector 808B to be coupled together. It is noted that connector 808A and connector 808B may be coupled together by adjusting a position of or more elements (e.g., retention element 814, ear element 810A, and ear element 810B) of device 800. By way of example, ear element 810B, ear element 810A, or both may be coupled to retention element 814 in a manner to allow ear element 810B, ear element 810A, or both, to rotate about retention element 814 and enable connector 808A to come into contact with connector 808B. As another example, retention element 814 may be adjusted (e.g., bent or snapped into a position) to enable connector 808A and connector 808B to be coupled together.

Coupling connector 808A and connector 808B together provides for a closed loop extending from first connector 808A, through each of ear element 810A, retention element 814, and ear element 810B to second connector 808B. As will be appreciated by a person having ordinary skill in the art, if connector 808A and connector 808B are coupled together (i.e., a closed loop is formed), antenna 804 may be configured to receive power wirelessly transmitted from a wireless power source.

Figure 8B:
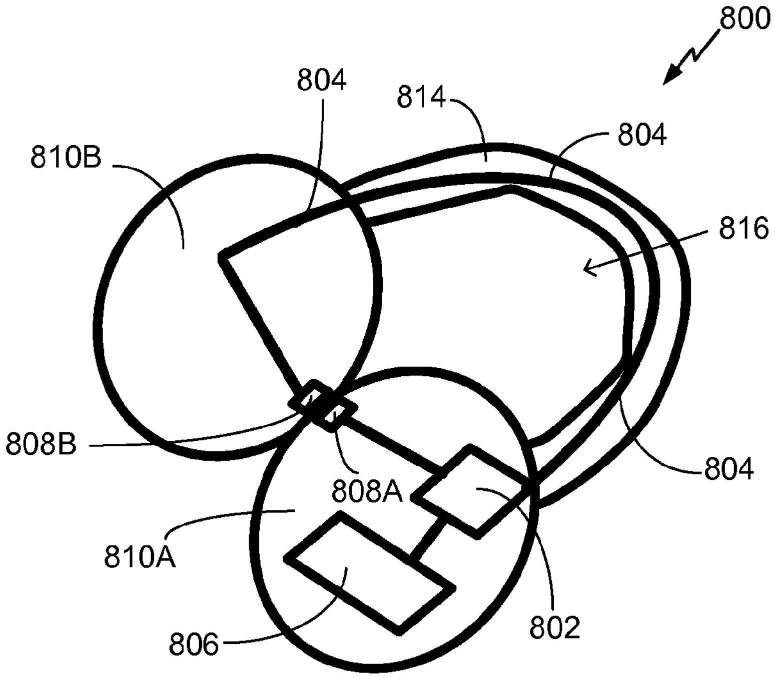
FIG. 8B is another illustration of the wireless power device of FIG. 8A in a configuration for receiving wireless power, in accordance with an exemplary embodiment of the present invention.

It is noted in FIG. 8A, device 800 is depicted as being in a configuration wherein first connector 808A and second connector 808B are not in contact with one another and, therefore, antenna 804 is configured as an open loop. FIG. 8B is an illustration of device 800 wherein connector 808A and connector 808B are in contact and, therefore, antenna 804 is configured as a closed loop. As illustrated in FIG. 8B, a gap 816, which comprises air, exists between at least a portion of ear element 810A and 810B and retaining element 814. As such, antenna 804 may comprise an air core loop antenna.

Figure 8C:
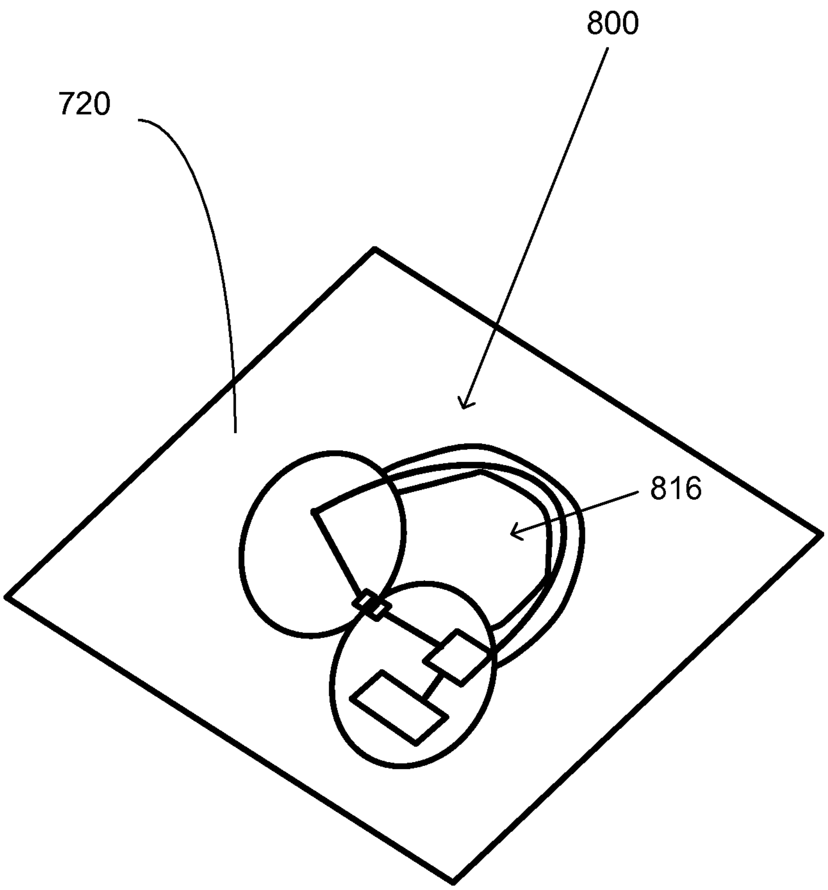
FIG. 8C depicts the wireless power device of FIG. 8B positioned within a charging region of another wireless device including a wireless power transmitter, in accordance with an exemplary embodiment of the present invention.

FIG. 8C is an illustration of device 800 positioned within a charging region of wireless power source 720 that includes a wireless power transmitter (e.g., transmitter 200 of FIG. 4). As illustrated in FIG. 8C, first connector 808A is in contact with second connector 808B and, therefore, antenna 804 is configured as a closed loop. Accordingly, as configured in the illustration of FIG. 8C, antenna 804 may receive power wirelessly transmitted from wireless power source 720. Upon reception thereof, power may be conveyed to energy storage device 806 via receiver 804.

During a contemplated operation, device 800 may be configured in a manner so as to connect connector 808A with connector 808B and, thus, form a closed loop antenna within device 800. Furthermore, upon device 800 being positioned within a near-field region of a wireless power source, device 800 and, more specifically, antenna 804, may wirelessly receive power from the wireless power source. As will be appreciated by a person having ordinary skill in the art, device 800 is configured to prevent receipt of wireless power while in use (i.e., while antenna 804 is an open loop; see FIG. 8A), and, therefore, device 800 may provide enhanced safety for a user of device 800.

Figure 9A:
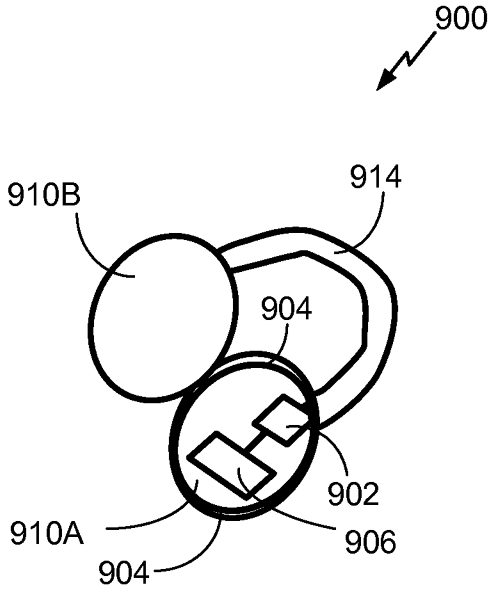
FIG. 9A illustrates another wireless power device including a wireless power receiver, according to an exemplary embodiment of the present invention.
Figure 9B:
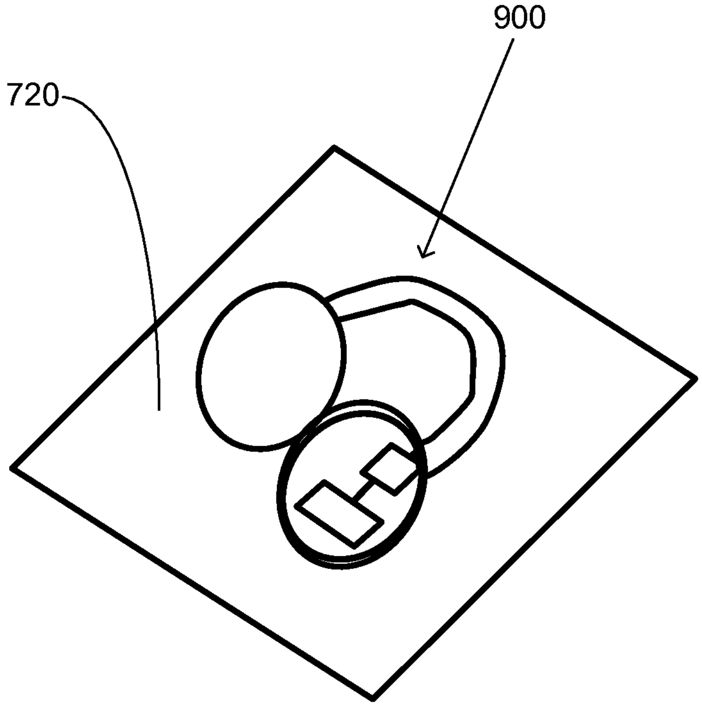
FIG. 9B illustrates the wireless power device of FIG. 9A positioned within a charging region of another wireless device including a wireless power transmitter, according to an exemplary embodiment of the present invention.

FIG. 9A illustrates another device 900 having a receiver 902 and a receive antenna 904 integrated therein. Device 900 is depicted in FIG. 9A as a headset including a retention element 914 and ear elements 910A and 910B. Device 900 may further include an energy storage device 906 operably coupled to receiver 902. Energy storage device 906 may comprise, for example only, a battery. As depicted in FIG. 9A, energy storage device 906 and receiver 902 may be integrated within earpiece 910A. Moreover, it is noted that receive antenna 904 is integrated within ear piece 910A. FIG. 9B illustrates device 900 positioned within a charging region of a wireless power device 720, which includes a wireless power transmitter (e.g., transmitter 200 of FIG. 4).

Figure 10A:
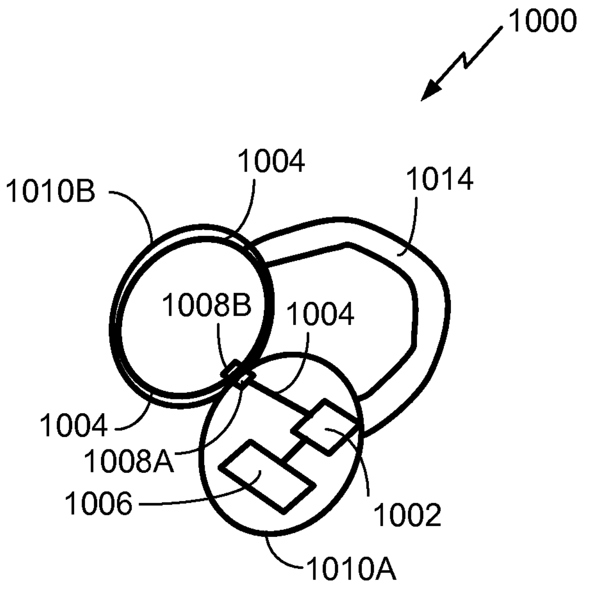
FIG. 10A illustrates another wireless power device including a wireless power receiver, according to an exemplary embodiment of the present invention.

FIG. 10A illustrates a device 1000 having a receiver 1002 and a receive antenna 1004 integrated therein. Device 1000 is depicted in FIG. 10A as a headset including a retention element 1014, and ear elements 1010A and 1010B. Device 1000 may further include an energy storage device 1006 operably coupled to receiver 1002. Energy storage device 1006 may comprise, for example only, a battery. As illustrated in FIG. 10A, receiver 1002 and energy storage device 1006 are integrated in ear element 1010A. Moreover, receive antenna 1004 is integrated within ear element 1010B. Device 1000 further includes a connector 1008B coupled to antenna 1004 and integrated within ear element 1010B. In addition, device 1000 includes another connector 1008A coupled to antenna 1004 and integrated within ear element 1010A. It is noted that each of connector 1008A and connector 1008B may be at least partially exposed through respective ear elements.

According to one exemplary embodiment, device 1000 is configurable so as to enable connector 1008A and connector 1008B to be coupled together. It is noted that connector 1008A and connector 1008B may be coupled together by adjusting a position of or more elements (e.g., retention element 1014, ear element 1010A, and ear element 1010B) of device 1000. By way of example, ear element 1010B, ear element 1010A, or both, may be coupled to retention element 1014 in a manner to allow ear element 1010B, ear element 1010A, or both, to rotate about retention element 1014 and enable connector 1008A to come into contact with connector 1008B. As another example, retention element 1014 may be adjusted (e.g., bent or snapped into a position) to enable connector 1008A and connector 1008B to be coupled together.

Coupling connector 1008A and connector 1008B enable antenna 1004 to couple to receiver 1002. As will be appreciated by a person having ordinary skill in the art, if connector 808A and connector 808B are coupled together (i.e., a closed loop is formed), antenna 804 may be configured to convey power, wirelessly received, to receiver 1002.

Figure 10B:
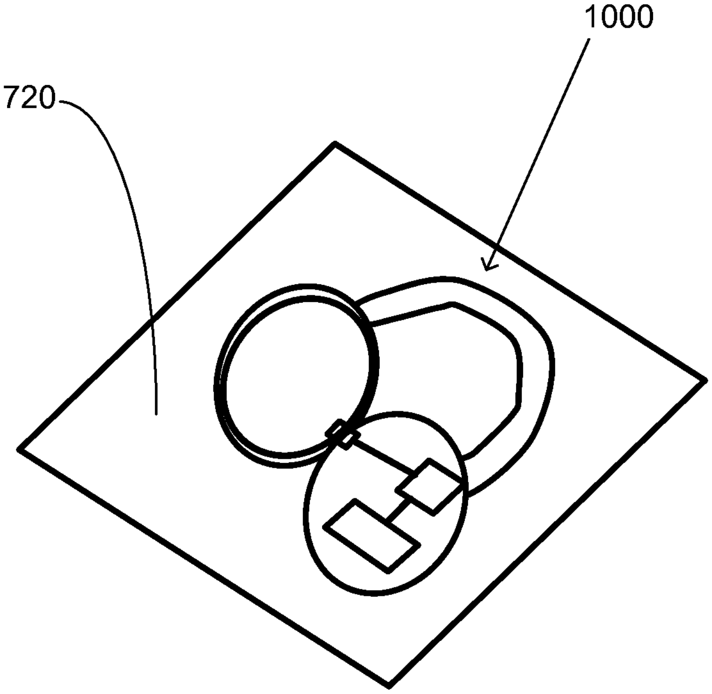
FIG. 10B illustrates the wireless power device of FIG. 10A positioned within a charging region of another wireless device including a wireless power transmitter, according to an exemplary embodiment of the present invention.

It is noted in FIG. 10A, device 1000 is depicted as being in a configuration wherein first connector 1008A and second connector 1008B are not in contact with one another and, therefore, antenna 1004 is decoupled from receiver 1002. FIG. 10B is an illustration of device 1000 wherein connector 1008A and connector 1008B are in contact and, therefore, antenna 1004 is coupled to receiver 1002. FIG. 10C is an illustration of device 1000 positioned within a charging region of wireless power source 720 that includes a wireless power transmitter (e.g., transmitter 200 of FIG. 4). As illustrated in FIG. 10C, first connector 1008A is in contact with second connector 1008B and, therefore, antenna 1004 is coupled to receiver 1002. Accordingly, as configured in the illustration of FIG. 10C, antenna 1004 may receive power wirelessly transmitted from wireless power source 720 and, upon reception thereof, may power may convey power to energy storage device 1006 via receiver 1002.

During a contemplated operation, device 1000 may be configured in a manner so as to connect connector 1008A with connector 1008B and, thus, couple receive antenna 1004 and receiver 1002 together. Furthermore, upon device 1000 being positioned within a near-field region of a wireless power source, antenna 1004 may wirelessly receive power from the wireless power source and convey the power to receiver 1002. As will be appreciated by a person having ordinary skill in the art, device 1000 is configured to prevent receipt of wireless power while in use (i.e., while antenna 704 is decoupled from receiver 1002) and, therefore, device 1000 may provide enhanced safety for a user of device 1000.

Figure 11A:
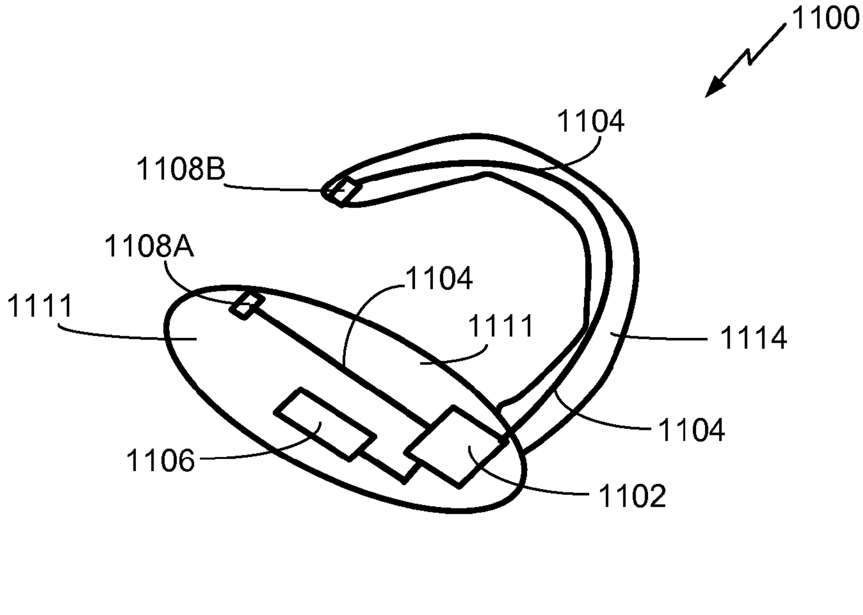
FIG. 11A illustrates another wireless power device including a wireless power receiver, according to an exemplary embodiment of the present invention.

FIG. 11A illustrates a device 1100 having a receiver 1102 and a receive antenna 1104 integrated therein. Device 1100 is depicted in FIG. 11A as a headset including a base 1111 and an ear element 1114. As will be understood by a person having ordinary skill in the art, ear element 1114 may comprise an ear clip configured to wrap around at least a portion of a user's ear. For example only, device 1100 may include a wireless headset such as a Bluetooth headset. Device 1100 may further include an energy storage device 1106 operably coupled to receiver 1102. Energy storage device 1106 may comprise, for example only, a battery.

As illustrated in FIG. 11A, receiver 1102 and energy storage device 1106 are integrated in base 1111. Moreover, it is noted that receive antenna 1104 is integrated within each of ear element 1114 and base 1111. Device 1100 further includes a connector 1108B coupled to antenna 1104 and integrated within ear element 1114. In addition, device 1100 includes another connector 1108A coupled to antenna 1104 and integrated within base 1111. It is noted that each of connector 1108A and connector 1108B may be at least partially exposed through base 1111 and ear element 1114, respectively.

According to one exemplary embodiment, device 1100 is configurable so as to enable connector 1108A and connector 1108B to be coupled together. It is noted that connector 1108A and connector 1108B may be coupled together by adjusting a position of ear element 1114. By way of example, ear element 1114 and base 1111 may be coupled together in a manner to allow ear element 1114 to rotate about base 1111 and enable connector 708A to come into contact with connector 708B. As a more specific example, ear element 1114 may rotate about base 1111 and "snap" into a position wherein connector 708A and connector 708B are coupled together.

Figure 11B:
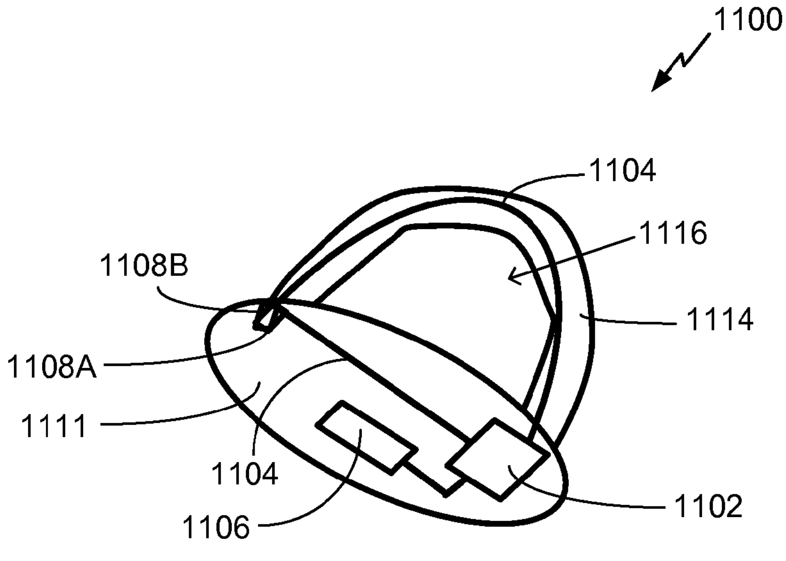
FIG. 11B is another illustration of the wireless power device of FIG. 11A in a configuration for receiving wireless power, in accordance with an exemplary embodiment of the present invention.

It is noted in FIG. 11A, device 1100 is depicted as being in a configuration wherein first connector 1108A and second connector 1108B are not in contact with one another and, therefore, antenna 1104 is configured as an open loop. FIG. 11B is an illustration of device 1100 wherein connector 1108A and connector 1108B are in contact and, therefore, antenna 1104 is configured as a closed loop. As illustrated in FIG. 11B, a gap 1116, which comprises air, exists between at least a portion of ear element 1114 and base 1111. As such, antenna 1104 may comprise an air core loop antenna.

Figure 11C:
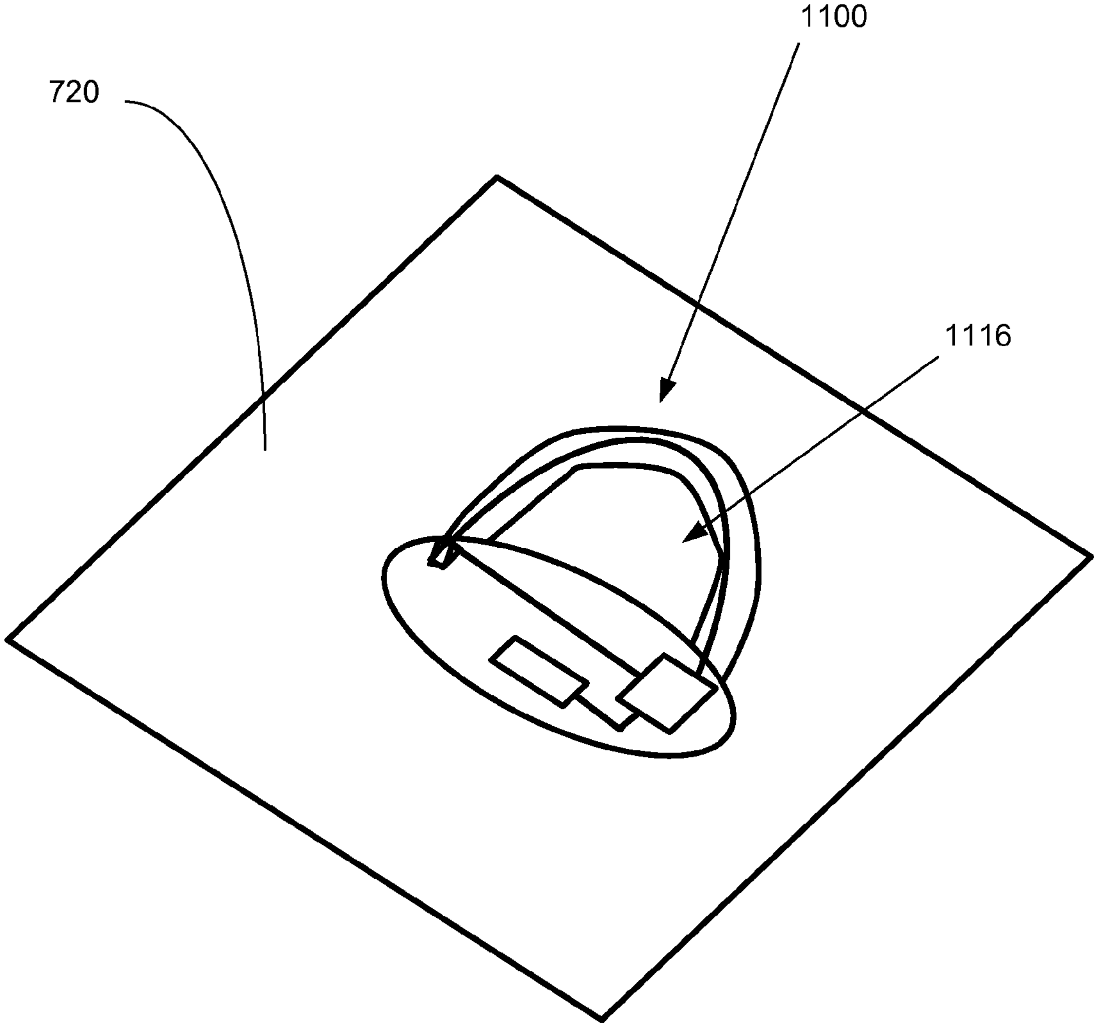
FIG. 11C depicts the wireless power device of FIG. 11B positioned within a charging region of another wireless device including a wireless power transmitter, in accordance with an exemplary embodiment of the present invention.

FIG. 11C is an illustration of device 1100 positioned within a charging region of wireless power source 720 that includes a wireless power transmitter (e.g., transmitter 200 of FIG. 4). As illustrated in FIG. 11C, first connector 1108A is in contact with second connector 1108B and, therefore, antenna 1104 is configured as a closed loop. According, as configured in the illustration of FIG. 11C, antenna 1104 may receive power wirelessly transmitted from wireless power source 720. As will be appreciated by a person having ordinary skill in the art, gap 1116 may enhance wireless power transfer between wireless power source 720 and antenna 1104. Upon reception thereof, power may be conveyed to energy storage device 1106 via receiver 1104.

During a contemplated operation, device 1100 may be configured in a manner so as to connect connector 1108A with connector 1108B and, thus, form a closed loop antenna within device 1100. Furthermore, upon device 1100 being positioned within a near-field region of a wireless power source, device 1100 and, more specifically, antenna 1104, may wirelessly receive power from the wireless power source. As will be appreciated by a person having ordinary skill in the art, device 1100 is configured to prevent receipt of wireless power while in use (i.e., while antenna 1104 is an open loop; see FIG. 11A), and, therefore, device 1100 may provide enhanced safety for a user of device 1100.

Figure 12A:
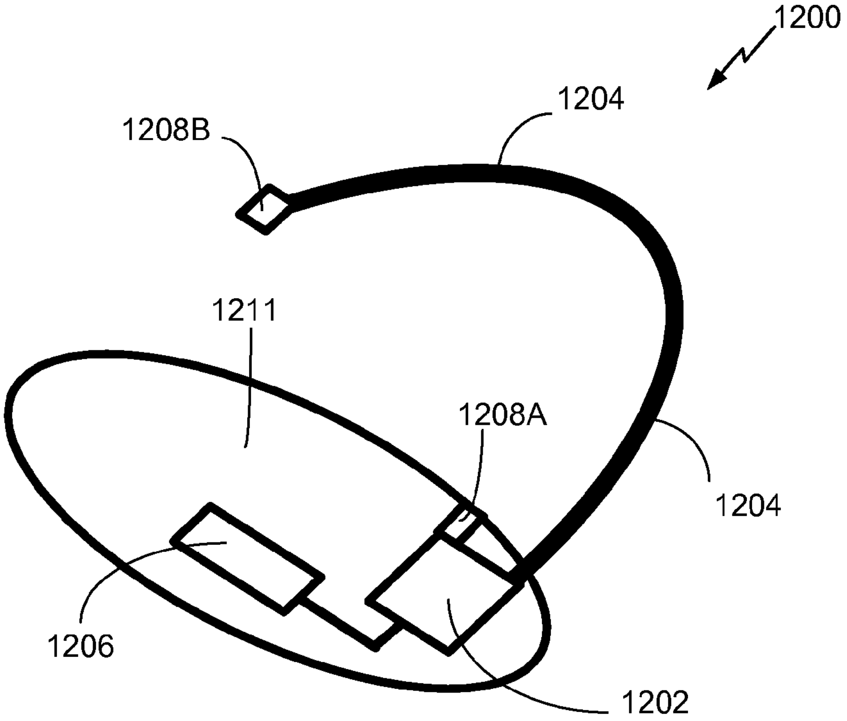
FIG. 12A illustrates yet another wireless power device including a wireless power receiver, according to an exemplary embodiment of the present invention.

FIG. 12A illustrates a device 1200 having a receiver 1202 integrated therein. Device 1200 is depicted in FIG. 12A as a headset including an antenna 1204 and a base 1211. Device 1200 may further include an energy storage device 1206 operably coupled to receiver 1202. Energy storage device 1206 may comprise, for example only, a battery. As illustrated in FIG. 12A, receiver 1202, energy storage device 1206, and a portion of antenna 1204 are integrated in base 1211. Device 1200 further includes a connector 1208B coupled to antenna 1204. In addition, device 1200 includes another connector 1208A coupled to antenna 1204 and integrated within base 1211. It is noted that each of connector 1208A may be at least partially exposed through base 1211.

According to one exemplary embodiment, device 1200 is configurable so as to enable connector 1208B and connector 1208B to be coupled together. It is noted that connector 1108A and connector 1108B may be coupled together by adjusting a position of at least a portion of antenna 1204 relative to base 1211. By way of example, a shape of antenna 1204, which may comprise a flexible wire, may be adjusted (e.g., bent) to enable connector 1208B to come into contact with connector 1208A. Furthermore, it is noted that one or more elements may be used to secure connector 1208B to connector 1208A.

Figure 12B:
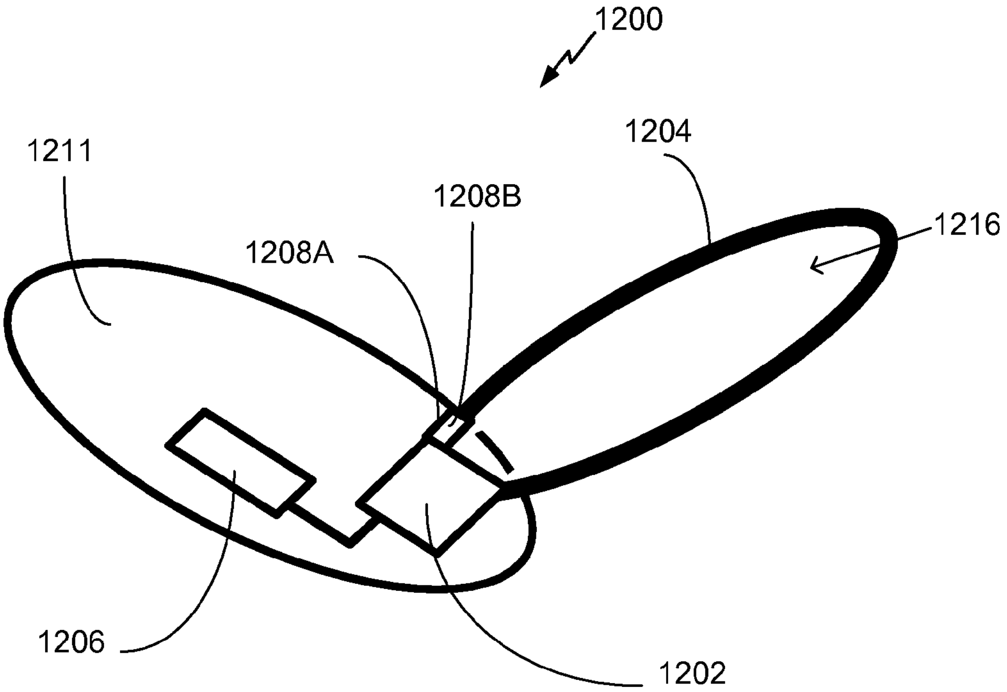
FIG. 12B is another illustration of the wireless power device of FIG. 12A in a configuration for receiving wireless power, in accordance with an exemplary embodiment of the present invention.

It is further noted that in FIG. 12A, device 1200 is depicted as being in a configuration wherein first connector 1208A and second connector 1208B are not in contact with one another and, therefore, antenna 1204 is configured as an open loop. FIG. 12B is an illustration of device 1200 wherein connector 1208A and connector 1208B are in contact and, therefore, antenna 1204 is configured as a closed loop. As illustrated in FIG. 12B, a gap 1216, which comprises air, exists between at least a portion of antenna 1204 and base 1111. As such, antenna 1204 may comprise an air core loop antenna.

Figure 12C:
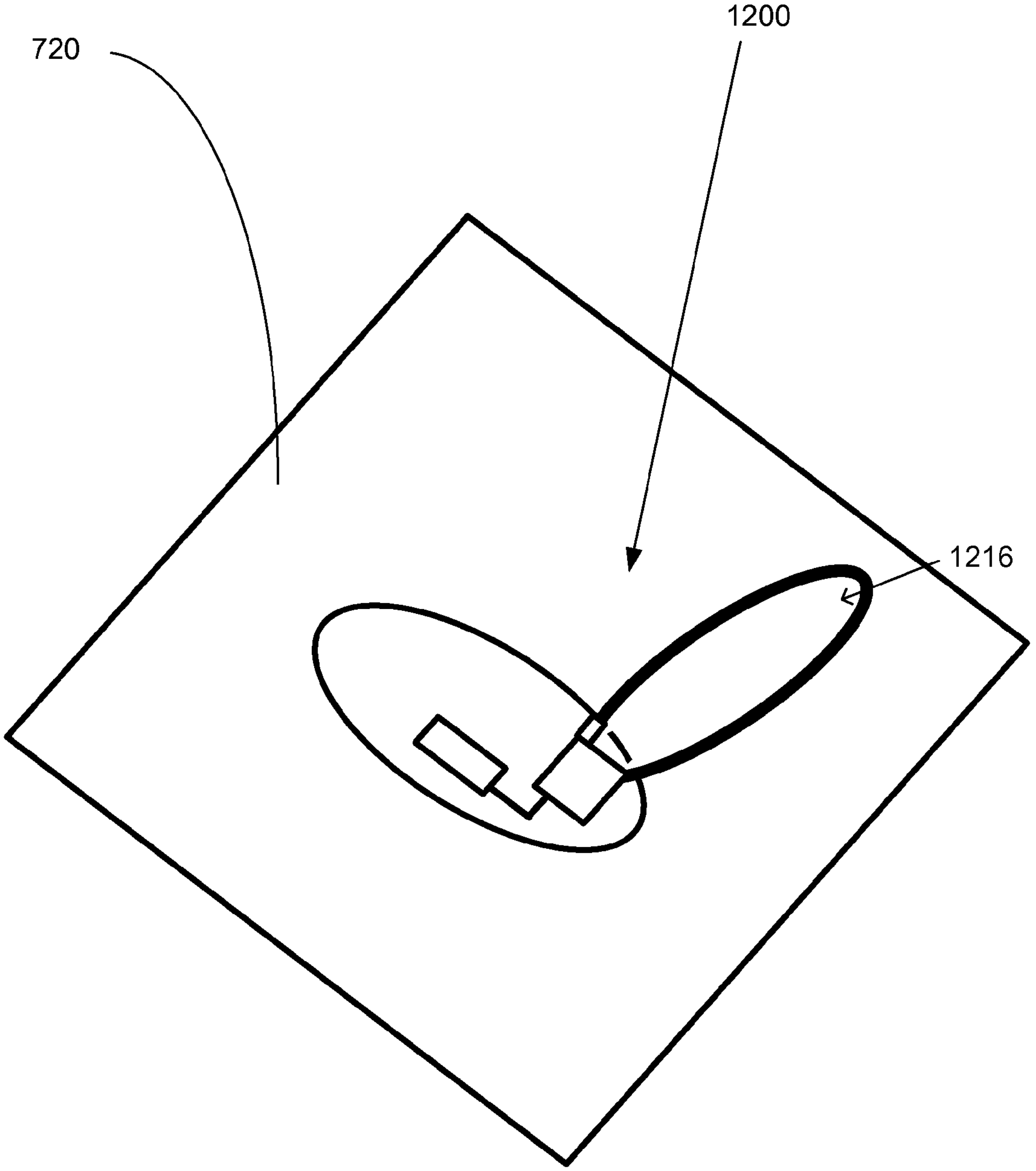
FIG. 12C depicts the wireless power device of FIG. 12B positioned within a charging region of another wireless device including a wireless power transmitter, in accordance with an exemplary embodiment of the present invention.

FIG. 12C is an illustration of device 1200 positioned within a charging region of wireless power source 720 that includes a wireless power transmitter (e.g., transmitter 200 of FIG. 4). As illustrated in FIG. 12C, first connector 1208A is in contact with second connector 1208B and, therefore, antenna 1204 is configured as a closed loop. According, as configured in the illustration of FIG. 12C, antenna 1204 may receive power wirelessly transmitted from wireless power source 720. Upon reception thereof, power may be conveyed to energy storage device 1206 via receiver 1204.

During a contemplated operation, device 1200 may be configured in a manner so as to connect connector 1208A with connector 1208B and, thus, form a closed loop antenna within device 1200. Furthermore, upon device 1200 being positioned within a near-field region of a wireless power source, device 1200 and, more specifically, antenna 1204, may wirelessly receive power from the wireless power source. As will be appreciated by a person having ordinary skill in the art, device 1200 is configured to prevent receipt of wireless power while in use (i.e., while antenna 1204 is an open loop; see FIG. 12A), and, therefore, device 1200 may provide enhanced safety for user of device 1200.

Figure 13:
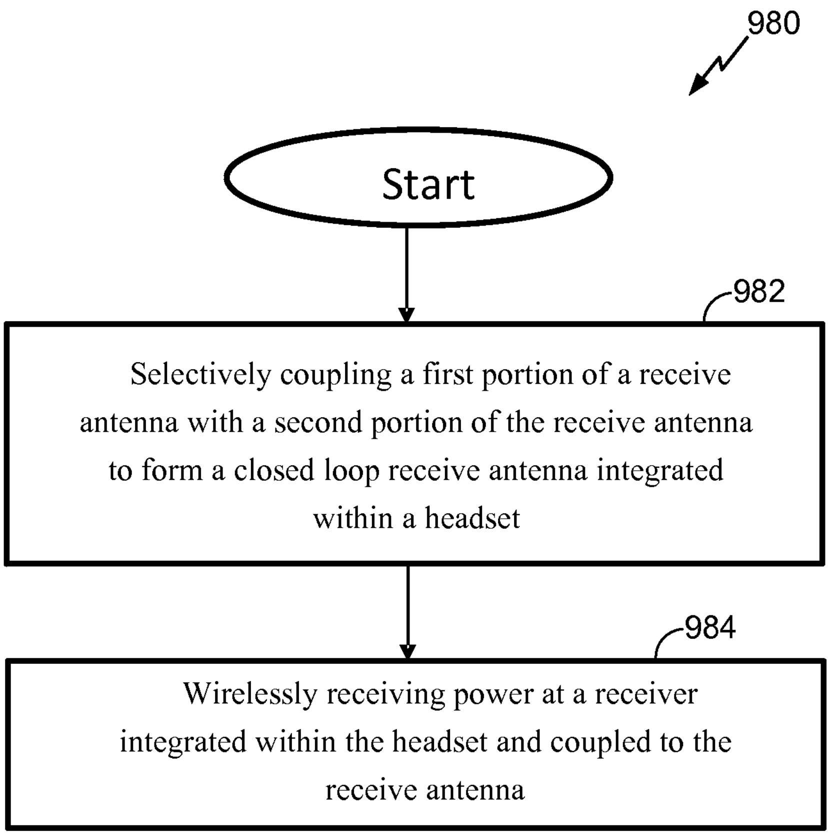
FIG. 13 is a flowchart illustrating yet another method, according to an exemplary embodiment of the present invention.

FIG. 13 is a flowchart illustrating a method 980, in accordance with one or more exemplary embodiments. Method 980 may include selectively coupling a first portion of a receive antenna with a second portion of the receive antenna to form a closed loop receive antenna integrated within a headset (depicted by numeral 982). Method 980 may further include wirelessly receiving power at a receiver integrated within the headset and coupled to the receive antenna (depicted by numeral 984).

The exemplary embodiments described above may enhance a size (i.e., an area) of a receive antenna and, therefore, may enable for more efficient wireless power transfer. Furthermore, because various devices of the above-described embodiments may prevent receipt of wireless power while a device is in operation (i.e., while a headset is in use and proximate a user's head), the safety of the devices may be enhanced. Stated another way, various devices of the above-described embodiments are configured in a manner so as to prevent receipt of wireless power while the device is being used in a conventional manner (e.g., while the device is attached to an ear). Accordingly, various devices described herein may enable for enhanced safety. It is noted that in one exemplary embodiment, a receiver (e.g., receiver 702) may be disabled while an associated receive antenna (e.g., antenna 704) is in an open loop configuration. It is noted that although various exemplary embodiment described herein include a receive antenna having a single separable portion, an antenna having multiple separable portions is within the scope of the present invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:

a wireless power receiver; and a receive antenna operably coupled to the wireless power receiver and having a portion configured to selectively form at least one of an open loop antenna and a closed loop antenna.

2. The device of claim 1, further comprising a headset, wherein the receiver is integrated within an ear element of the headset.

3. The device of claim 2, wherein the ear element further includes an energy storage device integrated therein and coupled to the receiver.

4. The device of claim 1, further comprising a headset including a pair of ear elements, a retention element, and a microphone boom.

5. The device of claim 4, wherein the antenna is integrated within each ear element of the pair of ear elements, the retention element, and the microphone boom.

6. The device of claim 1, wherein the portion comprises a pair of connectors configured for coupling together to selectively form a closed loop antenna.

7. The device of claim 6, further comprising a headset, wherein a first connector of the pair of connectors is integrated at least partially within a first ear element of the device and a second connector of the pair of connectors is integrated at least partially within a microphone boom of the device.

8. The device of claim 7, wherein the microphone boom is configured to rotate about a second ear element of the device to enable the second connector to contact the first connector.

9. The device of claim 6, further comprising a headset, wherein a first connector of the pair of connectors is integrated at least partially within a first ear element of the device and a second connector of the pair of connectors is integrated at least partially within a second ear element of the device.

10. The device of claim 9, wherein at least one of the first ear element and the second ear element are configured to move relative to a retention member coupled therebetween to enable the second connector and the first connector to couple together.

11. The device of claim 6, further comprising a wireless headset, wherein a first connector of the pair of connectors is integrated at least partially within an ear clip of the wireless headset and a second connector of the pair of connectors is integrated at least partially within a base of the wireless headset.

12. The device of claim 11, wherein the ear clip is configured about the base to enable the second connector and the first connector to couple together.

13. The device of claim 1, wherein the receiver and at least a portion of the receive antenna are integrated within a base of a wireless headset.

14. The device of claim 13, wherein the base of the wireless headset comprises an energy storage device coupled to the receiver.

15. The device of claim 13, wherein at least another portion of the receive antenna is integrated in an ear clip of the wireless headset.

16. The device of claim 15, wherein the ear clip comprises a flexible wire.

17. The device of claim 1, further comprising a headset, wherein the receive antenna is configured for receiving wireless power in a closed loop configuration.

18. The device of claim 1, further comprising a headset, wherein the receive antenna is in an open loop configuration to prevent receipt of wireless power while proximate an ear of a user.

19. The device of claim 1, wherein the receive antenna comprises an air core.

20. A headset, comprising:

a first ear element, a second ear element, and a retention element coupled to each of the first ear element and the second ear element;

a receiver integrated within one of the first ear element and the second ear element; and a receive antenna integrated within one of the first ear element and the second ear element, the receive antenna comprising a pair of connectors configured for coupling together to selectively form a closed loop antenna.

21. The headset of claim 20, wherein each of the receive antenna and the receiver are integrated within a same ear element.

22. The headset of claim 20, wherein at least a portion of the receive antenna and the receiver are integrated within different ear elements.

23. The headset of claim 20, wherein a first connector of the pair of connectors is integrated at least partially within the first ear element and a second connector of the pair of connectors is integrated at least partially within the second ear element.

24. A method, comprising:

selectively coupling a first portion of a receive antenna with a second portion of the receive antenna to form a closed loop receive antenna integrated within a headset; and wirelessly receiving power at a receiver integrated within the headset and coupled to the closed loop receive antenna.

25. The method of claim 24, wherein selectively coupling a first portion of a receive antenna with a second portion of the receive antenna comprises coupling a first connector coupled to the first portion and integrated within a microphone boom of the headset to a second connector coupled to the second portion and integrated with an ear element of the headset.

26. The method of claim 24, wherein selectively coupling a first portion of a receive antenna with a second portion of the receive antenna comprises coupling a first connector coupled to the first portion and integrated within a first ear element of the headset to a second connector coupled to the second portion and integrated with a second ear element of the headset.

27. The method of claim 24, wherein selectively coupling a first portion of a receive antenna with a second portion of the receive antenna comprises coupling a first connector coupled to the first portion and integrated within an ear clip of the headset to a second connector coupled to the second portion and integrated with a base of the headset.

28. The method of claim 24, further comprising selectively decoupling the first portion of the receive antenna from the second portion of the receive antenna prior to attaching the headset to a user.

29. The method of claim 28, wherein selectively decoupling the first portion of the receive antenna from the second portion of the receive antenna prior to attaching the headset to a user comprises forming an open loop antenna to prevent receipt of wireless power while the headset is attached to the user.

30. A device, comprising:

means for selectively coupling a first portion of a receive antenna with a second portion of the receive antenna to form a closed loop receive antenna integrated within a headset; and means for wirelessly receiving power, the receiving means integrated within the headset and coupled to the receive antenna.

* * * * *